United States Patent [19]

Caneau et al.

[11] Patent Number: 5,102,812

[45] Date of Patent: Apr. 7, 1992

[54] METHOD OF MAKING A LATERAL BIPOLAR HETEROJUNCTION STRUCTURE

[75] Inventors: Catherine G. Caneau, East Keansburg; John R. Hayes, Atlantic Highlands; Hoi-Jun Yoo, Princeton, all of N.J.

[73] Assignee: Bell Communications Research, Livingston, N.J.

[21] Appl. No.: 433,847

[22] Filed: Nov. 9, 1989

[51] Int. Cl.$^5$ ............................................. H01L 21/20
[52] U.S. Cl. ......................................... 437/32; 437/89; 437/122; 437/926; 357/35
[58] Field of Search ............... 357/16, 34, 35; 437/89, 437/90, 91, 92, 126, 129, 32, 122; 148/DIG. 11

[56] References Cited

U.S. PATENT DOCUMENTS

| | | | |
|---|---|---|---|
| 3,476,617 | 11/1969 | Robinson | 148/175 |
| 4,371,968 | 2/1983 | Trussell, Jr. et al. | 372/50 |
| 4,382,265 | 5/1983 | Pearsall | 357/16 |
| 4,426,767 | 1/1984 | Swanson et al. | 29/571 |
| 4,507,848 | 4/1985 | Smith | 437/32 |
| 4,545,113 | 10/1985 | Vora | 437/32 |
| 4,637,122 | 1/1987 | Carney et al. | 29/569 L |
| 4,644,381 | 2/1987 | Shieh | 357/35 |
| 4,662,983 | 5/1987 | Chin | 437/122 |
| 4,716,130 | 12/1987 | Johnston, Jr. et al. | 437/104 |
| 4,788,159 | 11/1988 | Smith | 437/90 |
| 4,951,601 | 8/1990 | Maydan et al. | 118/719 |
| 5,251,299 | 2/1981 | Baliga et al. | 148/171 |

FOREIGN PATENT DOCUMENTS

| | | | |
|---|---|---|---|
| 0074285 | 6/1977 | Japan | 437/133 |
| 0181060 | 10/1984 | Japan | 357/35 |
| 2079048 | 6/1981 | United Kingdom | 437/90 |

OTHER PUBLICATIONS

R. L. Thornton et al, "Unified Planar Process for Fabricating Heterojunction Bipolar Transistors and Buried-Heterostructure Lasers Utilizing Impurity-Induced Disordering," *Applied Physics Letters*, 1988, vol. 53, pp. 2669-2671.

T. K. Yoo et al, "Surface-Emitting AlGaAs/GaAs DH LED with Buried-Window Cylindrical Lens," *Japanese Journal of Applied Physics*, 1988, vol. 27, pp. L2357-L2360.

H. J. Yoo et al, "Fabrication of Lateral Planar InP-/GaInAsP Heterojunction Bipolar Transistor by Selective Area Epitaxial Growth," *Electronics Letters*, 1989, vol. 25, pp. 191-192.

H. J. Yoo et al, "Fabrication and Characterization of Lateral InP/InGaAsP Heterojunctions and Bipolar Transistors," *Applied Physics Letters*, 1989, vol. 54, pp. 2318-2320.

E. Kuphal, "Phase Diagrams of InGaAsP, InGaAs and InP Lattice-Matched to (100)InP," *Journal of Crystal Growth*, 1984, vol. 67, pp. 441-457.

*Primary Examiner*—Olik Chaudhuri
*Assistant Examiner*—Long Pham
*Attorney, Agent, or Firm*—Leonard Charles Suchyta; Charles S. Guenzer

[57] ABSTRACT

A method of fabricating a lateral bipolar heterojunction transistor and the transistor itself. In a first embodiment a first semiconductor layer of, for instance, InGaAsP is epitaxially grown on an insulating substrate with the subsequent selective area epitaxial regrowth of a second semiconductor layer, of for instance, InP on the substrate and adjacent to the base. The selective area regrowth forms the collector and emitter. Alternatively, the emitter and collector can be grown first and the base is regrown. In both cases, the semiconductor regrowth is epitaxial to the underlying substrate and to the semiconductor material at the side. Thereby, interface damage at the interface between the base and the emitter or collector is reduced so as to allow lateral minority carrier transport across the junction and small area junctions at low capacitance.

12 Claims, 6 Drawing Sheets

METHOD OF MAKING A LATERAL BIPOLAR HETEROJUNCTION STRUCTURE

FIELD OF THE INVENTION

The invention relates generally to bipolar transistors and other semiconductor structures and their method of making. In particular, the invention relates to such structures having a lateral conduction path across the heterojunction between two different materials and to the method of making the structures.

BACKGROUND OF THE INVENTION

A heterojunction bipolar transistor is one in which the emitter, base and collector regions are made of different semiconducting materials. In contrast, a homojunction bipolar transistor is made of a single crystalline composition with the regions and junctions therebetween defined by variations in the doping type and concentrations. In particular, there has been much recent effort directed toward the fabrication of InP-/GaInAs heterojunction bipolar transistors for inclusion as optical receivers or transmitters in InP-/GaInAsP optoelectronic integrated circuits (OEICs). However, to date such heterojunction structures have been fabricated vertically, usually in some sort of mesa structure. Such a vertical structure makes it difficult to reduce parasitic effects, such as extrinsic base resistance and collector capacitance, and to planarize the mesa.

Thornton et al have recently disclosed a lateral bipolar heterojunction transistor in a technical article entitled "Unified planar process for fabricating heterojunction bipolar transistors and buried-heterostructure laser utilizing impurity-induced disordering" appearing in Applied Physics Letters, volume 53, 1988 at pages 2669-2671. In this device, a 0.1 µm undoped GaAs layer is formed between two thicker p-type $Al_{0.4}Ga_{0.6}As$ layers. A central base region is then masked and Si is thermally diffused at 850° C. into the emitter and collector regions. Impurity-induced disordering causes the GaAs in the emitter and collector regions to convert to n-type AlGaAs while the thermal treatment simultaneously converts the GaAs in the base region to become p-type. However, this technique requires a large impurity density to accomplish the disordering and is further considered to be incompatible with optoelectronic fabrication technique.

SUMMARY OF THE INVENTION

Accordingly, it is an object of this invention to provide a lateral bipolar heterojunction transistor.

A further object of the invention is to fabricate such a structure which is compatible with other optoelectronic fabrication procedures.

The invention can be summarized as the device and method of making of a lateral bipolar heterojunction transistor or other semiconductor structure in which a first semiconductor layer is epitaxially formed on an insulating substrate. The first layer is then masked and etched away in such a manner as to expose one or more clean crystalline side faces of the first layer as well as to expose the substrate. Then, in a regrowth step, a second epitaxial semiconductor layer is deposited onto the substrate and adjacent to the side face or faces of the first layer so as to be epitaxial both to the substrate on the bottom and to the first layer on the side. The lateral epitaxial structure across the heterojunction provides a low-resistance current path through a heterojunction of small area and therefore low capacitance.

DETAILED DESCRIPTION

The first embodiment of the invention involves a lateral heterojunction bipolar transistor having an InGaAsP base layer epitaxially deposited on a substrate. The base layer is first photolithographically etched to roughly define the base and then further etched in situ to finally define the base before InP emitter and collector regions are regrown, that is, epitaxially grown on the substrate.

Figure 1:
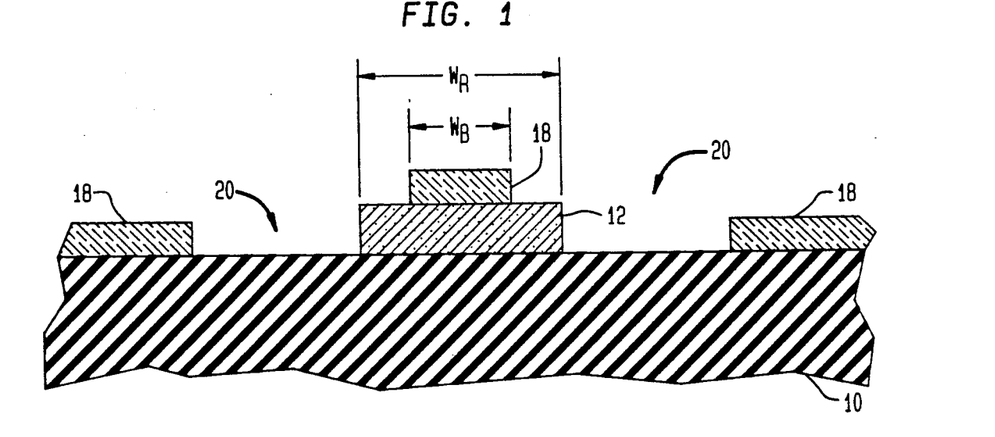
FIG. 1 is a cross-section of a transistor of a first embodiment of the present invention during an early fabrication stage, taken along a sectional line I—I of FIG. 2.
Figure 2:
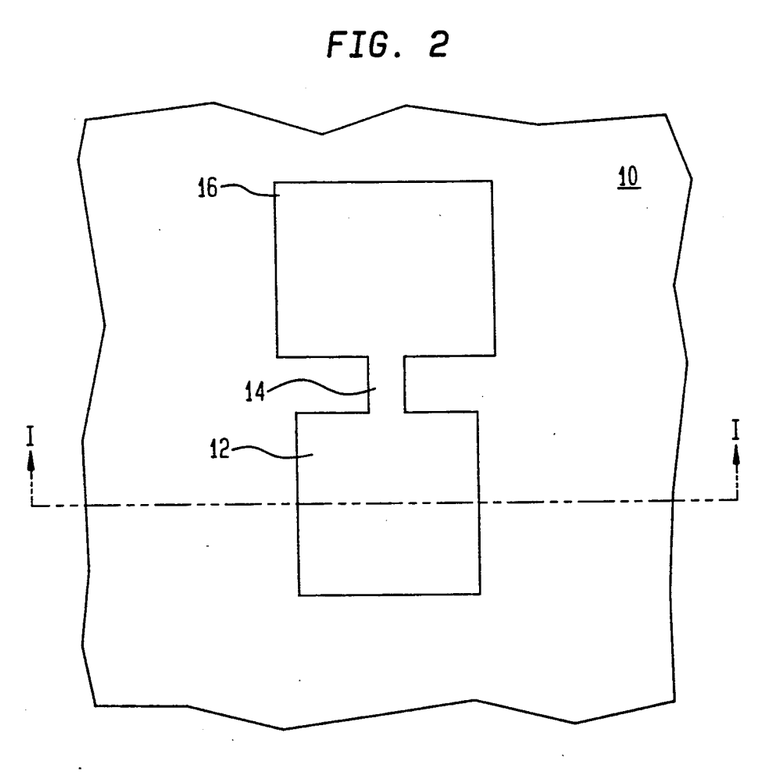
FIG. 2 is a plan view of the transistor of FIG. 1.

An example of the first embodiment is illustrated in FIG. 1. A 0.75 µm thick InGaAsP layer doped p-type with Zn to $5 \times 10^{17}$ cm$^{-3}$ was epitaxially grown by low-pressure organometallic chemical vapor (OMCVD) deposition on an Fe-doped semi-insulating substrate 10 of (100)-oriented InP. The composition of the layer was $In_{1-x}Ga_xAs_yP_{1-y}$, where x=0.29 and y=0.60, which corresponds to a wavelength of $\lambda_g = 1.3$ µm. Trimethylindium and trimethylgallium were used as the organometallic sources and arsine and phosphine as the hydride gas. Diethylzinc was used as the p-type dopant. The InGaAsP layer would eventually serve as the base. The base width was then roughly defined to a distance $W_R$ by photolithography and wet chemical etching, using $H_2SO_4:H_2O_2:H_2O$ (3:1:1 by volume), to form a roughly defined base 12. The exact value of $W_R$ is not critical but was set to about 10 µm. As illustrated in the plan view of FIG. 2, the roughly defined base 12 had an area of about $10 \times 10$ µm and was connected by a $2 \times 2$ µm neck 14 to a large base contact area 16.

Figure 3:
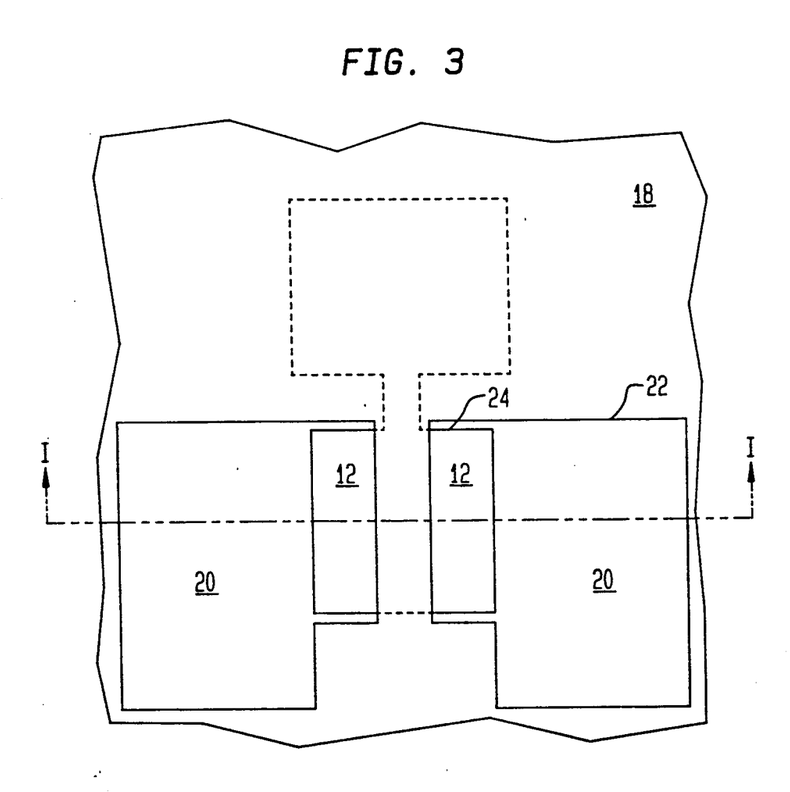
FIG. 3 is a plan view of the transistor of FIGS. 1 and 2 during a later fabrication stage.

The wafer was then covered with 200 nm of an $SiO_2$ layer 18 applied with a plasma-enhanced chemical vapor deposition method. As illustrated in the cross-section of FIG. 1 and the plan view of FIG. 3, two windows 20 of about $100 \times 100$ µm were opened in the $SiO_2$ layer 18 using an AZ1512 photolithographic mask and buffered HF as an etchant. The remaining portion of the $SiO_2$ layer 18 overlying the roughly defined base 12 had a width $W_B$ corresponding to the final base width, namely 2 µm. Widthwise sides 22 of the $SiO_2$ windows 20 extended further than corresponding sides 24 of the roughly defined base 12 so that the alignment was not critical.

Figure 4:
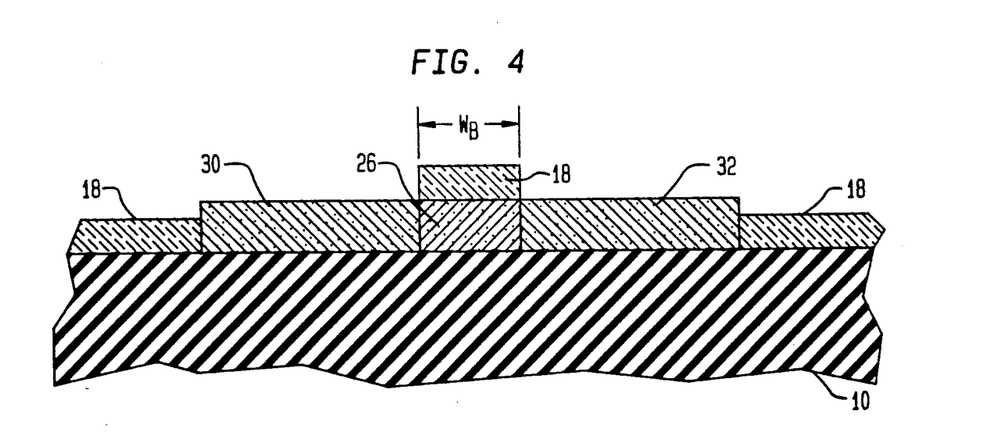
FIG. 4 is a cross-section of the transistor of FIG. 3, taken along the sectional line I—I of FIG. 3.

The sidewalls of the roughly defined base 12 were then etched through the windows 20 by in situ melt-back to reduce the base width to approximately $W_B$ to thereby form an InGaAsP base 26, as illustrated in FIG. 4. The melt-back was accomplished in an LPE (liquid phase epitaxy) chamber, used for subsequent growth, by placing the wafer in contact at a first station with a Ga-In-As-P melt just prior to regrowth of the emitter and collector. At 588° C., the temperature of the melt-back, the melt was undersaturated with Ga, As and P and contained an excess of In. The melt would have been saturated at 583° C. The composition of the melt was calculated by the formulas given by Kuphal in an article entitled "Phase diagrams of InGaAsP, InGaAs and InP lattice matched to (100) InP" appearing in Journal of Crystal Growth, volume 67, 1984 at pages 441–457. If this melt had been used at 577° C., it would have yielded an InGaAsP layer lattice matched to InP with $\lambda_g = 1.3$ μm. A calibration run of the melt-back etch, using the same conditions as for the transistor fabrication, yielded an etch depth of 200 nm after 10 seconds for an undersaturation of ~5° C., for which no undercutting of the $SiO_2$ was observed. The effectiveness of melt-back etching of selected crystallographic planes for providing optically flat surfaces has already been reported by T-K. Yoo et al in an article entitled "Surface-Emitting AlGaAs/GaAs DH LED with Buried-Window Cylindrical Lens" appearing in Japanese Journal of Applied Physics, volume 27, 1988 at pages L2357–L2360. It is noted that an attempt to use an etchant of $H_2SO_4:H_2O_2:H_2O$ (3:1:1 by volume), which selectively etches InGaAsP relative to InP, did not produce equally good transistor characteristics.

After the in situ etch-back, the sample remained in the LPE chamber but was moved to a second station therein and an InP layer was grown by LPE to simultaneously form an emitter region 32 and a collector region 30, corresponding to the two windows 20 in the $SiO_2$ layer 18. The InP was grown n-type with a concentration of $1 \times 10^{17}$ cm$^{-3}$ of tin. The In-P melt at the second station was supersaturated in P. The InP was selectively grown only in the windows 20 because LPE growth has a much greater growth rate for epitaxial growth over the InP substrate 10 than over the amorphous $SiO_2$ layer 18. For the InP LPE growth, a two-phase solution method (polycrystalline InP immersed in the InP melt) was used to control the supersaturation. The melt homogenization temperature was 600° C. and the growth temperature was 588° C. The cooling rate during growth was maintained at 1.5° C./min so that surface planarization was obtained in about 1 minute. This epitaxial growth after removal of another layer is referred to as regrowth and has presented major technical difficulties in the prior art because the removal tends to introduce surface defects and therefore interface states. Past problems with regrowth have prevented selective area epitaxial growth. It is further noted that the in situ etch-back allowed the emitter and collector regions 30 and 32 to be not only epitaxial to the underlying InP substrate 10 but also to have an epitaxial interface with the InGaAsP base 26.

Figure 5:
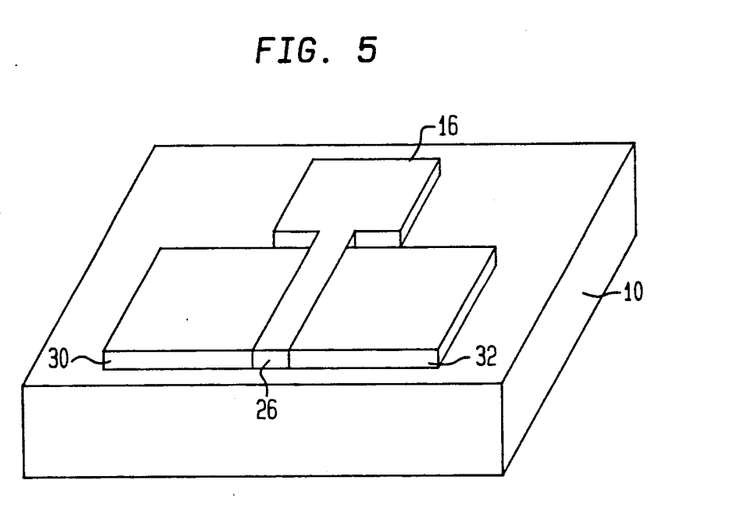
FIG. 5 is a perspective view of the transistor of FIGS. 3 and 4.

A perspective view of the fabricated transistor is shown in FIG. 5, which does not show the $SiO_2$ covering all the exposed substrate 10 and all portions of the base region 26 and base contact 16 and does not illustrate the non-rectangular shapes of the emitter and base regions 30 and 32, which correspond to the shapes of the windows 22. Ohmic contacts were applied by alloying the respective regions. A contact area was opened in the $SiO_2$ overlying the GaInAsP base contact using photolithography and buffered HF etchant. With the photoresist mask left in place, Au-Be was then evaporated to surface alloy part of the GaInAsP base contact. When the photoresist was removed, the Au-Be overlying the photoresist was lifted off. Contact areas in a new layer of photoresist were then photographically defined over the InP emitter and collector regions 30 and 32. Au-Ge-Ni was then evaporated to surface alloy part of the emitter and collector regions 30 and 32. Again, the excess Au-Ge-Ni was lifted off with the photoresist. Gold wires could have been ohmically bonded to the surface alloyed regions. However, the fabricated transistors were characterized using movable probes contacting the three contact areas.

There resulted a lateral bipolar heterojunction transistor having an emitter area adjacent the base of 0.75 μm × 8 μm and a base width of 2 μm. The transistor exhibited a maximum current gain of 6 at low current levels in a common-emitter configuration. This gain was considerably better than that previously available in transistors with regrown active regions. However, it was still considerably less than that available from vertical mesa structures. The ideality factor was typically found to be 1.36. It is anticipated that surface passivation of the base region would enhance the minority carrier lifetime and thus the gain. Furthermore, it appears desirable to perform all processing in one chamber so that the junctions are never exposed to ambient conditions, that is, air.

The inventors have described the first embodiment in print in two technical articles by H-J. Yoo et al entitled "Fabrication of lateral planar InP/GaInAsP heterojunction bipolar transistor by selective area epitaxial growth" appearing in Electronics Letters, volume 25, 1989 at pages 191 and 192 and "Fabrication and characterization of lateral InP/InGaAsP heterojunctions and bipolar transistors" appearing in Applied Physics Letters, volume 54, 1989 at pages 2318–2320.

The above-embodiment involved in In melt-back etch performed in situ with the subsequent LPE regrowth of InP. Thereby, the sample remained in the environmentally and pressure controlled chamber between the etching and the regrowth. If the InP regrowth were performed by OMCVD, the in situ etching could be performed by an etching gas, such as HCl:HBr, injected into the OMCVD chamber. The chamber would not be vented to ambient between etching and regrowth. Similar in situ etching is available for molecular beam epitaxy (MBE).

The previously described embodiment relies upon regrowth of the emitter and collector. A second embodiment relies upon regrowth of the base. As illustrated in cross-section in FIG. 6, on a semi-insulating InP substrate 40, having the same composition and orientation as the substrate 10 of the first embodiment, there was grown by OMCVD an n-type InP layer 42 of 0.75 μm thickness doped with $1 \times 10^{17}$ cm$^{-3}$ of silicon. A 0.2 μm $SiO_2$ layer 44 was then deposited by plasma-enhanced CVD. As illustrated in cross-section in FIG. 7 and in plan view in FIG. 8, the $SiO_2$ layer 44 was then photolithographically patterned to form two $SiO_2$ islands 46 and 48 corresponding to the later defined emitter and collector and their contact areas. The islands 46 and 48 in the vicinity of the base were separated by a groove 50 of width 2 μm. That is, the patterned and formed $SiO_2$ layer 44 acts as a mask comprising the two $SiO_2$ islands 46 and 48 separated by the base-region groove 50. The sample was then etched in $HCl:H_3PO_4$ (3:1 by volume) for 8 to 10 seconds at 20° C. so as to completely etch through the InP layer 42. The etching produced a truncated V-shaped groove 52 (55° inclination angle) penetrating through the InP layer 42 between the islands 46 and 48 so as to expose a portion of the substrate 10. The etching also removed the surrounding InP layer 42 so as to produce an emitter region 54 and a collector region 56, both of n-type InP. The V-shaped groove 52 is illustrated as truncated but it may extend into the insulating substrate 40 and form a sharp point without affecting the invention.

Figure 6:
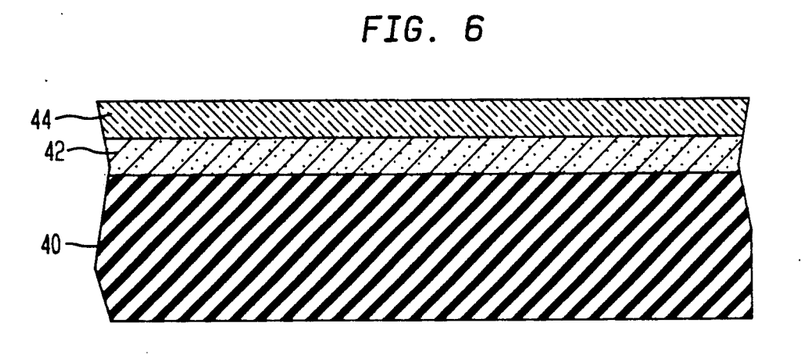
FIGS. 6 and 7 are cross-sections of a transistor of a second embodiment of the present invention at two points in its fabrication, taken along sectional line VI—VI of FIG. 8.
Figure 7:
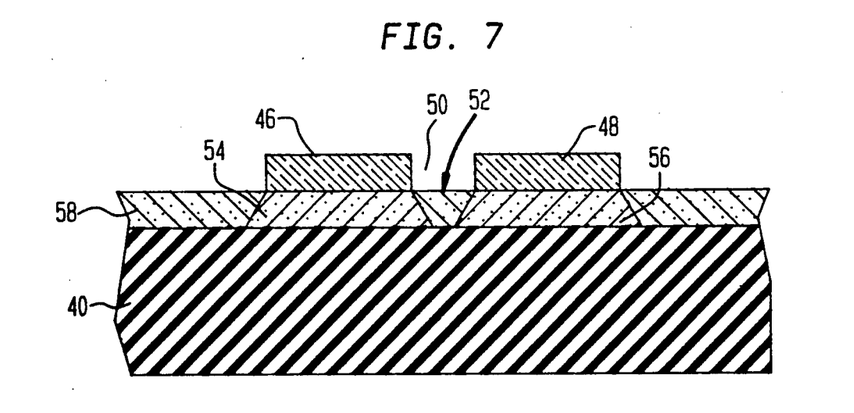
Figure 8:
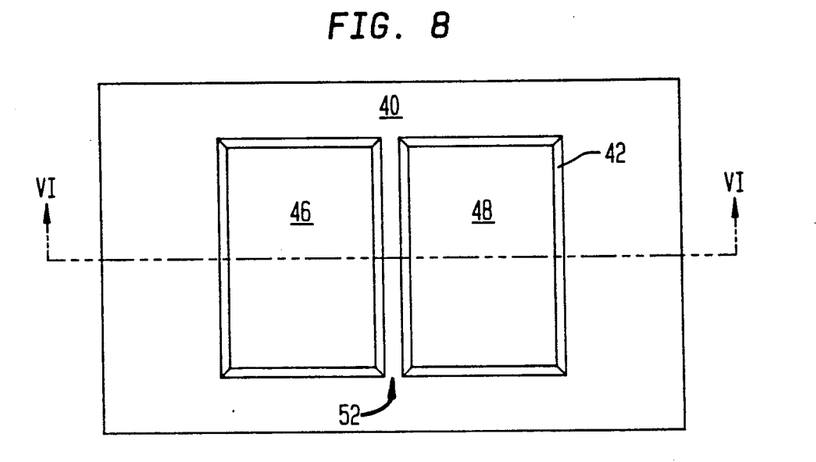
FIG. 8 is a plan view of the transistor of the second embodiment during its fabrication.

The selective-area regrowth was then performed to form the base. A p-type InGaAsP layer 58 was grown by the same process and with the same composition as the InGaAsP regions 30 and 32 of the first embodiment. The InGaAsP layer 58 had a doping concentration from Mn of $1 \times 10^{18}$ cm$^{-3}$.

The regrowth formed not only the base and its contact area but also formed over the surrounding exposed InP layer 40. In an isolation etching step, the InGaAsP was photographically masked in the area of the emitter, the collector, the base, and the base contact. The exposed InGaAsP was then etched through with $H_2SO_4:H_2O_2:H_2O$ (3:1:1 by volume) so as to provide a transistor very similar to that illustrated for the first embodiment in FIG. 5 except for the inclined junctions between the base and emitter and between the base and collector. By means of the lift-off surface alloying technique described for the first embodiment, the emitter and collector regions 54 and 56 were provided ohmic contact areas of Au-Ge-Ni. Similarly, the V-groove area and the base contact area were coated with Au-Be. Alloying was done with a rapid thermal annealing system for 20 seconds.

Figure 9:
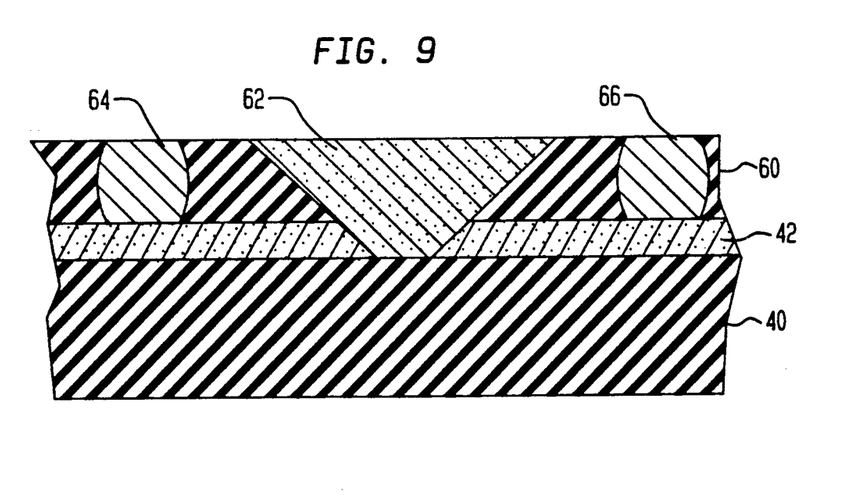
FIG. 9 is a cross-sectional view of a third embodiment of the invention, which is an improvement of the second embodiment.

The transistor was tested and it showed transistor action although the gain was approximately one. It is believed that performance will be improved with the structure of the third embodiment shown in FIG. 9. Just as in the second embodiment, the n-type InP layer 42 is epitaxially grown on the semi-insulating InP substrate 40. However, in the third embodiment a semi-insulating InP surface layer 60 is epitaxially grown on the n-type InP layer 42. A V-shaped groove is then etched through both the semi-insulating surface layer 60 and the n-type InP layer 42 with an anisotropic etchant. A base region 62 of p-type InGaAsP is then regrown in the groove. Contact vias 64 and 66 are formed through the semi-insulating surface layer 60, for example, by a heavy n-type ion implantation. Transistor performance should be improved because only a small edge of the V-shaped base region 62 is connected to the emitter or the collector region 42.

What is claimed is:

1. A method of for fabricating a lateral, heterojunction, bipolar transistor, comprising the steps of:
   a first step of epitaxially forming on a crystalline substrate a first film of a first semiconductor composition and of a first conductivity type;
   lithographically forming a roughly defined base region and a contact area in said first film;
   then depositing and defining an etching mask over a first region of said first film, wherein said etching mask comprises
   a second region overlying said first region of said first film, and first and second windows penetrating through said mask and separated by said second region, said second region of said mask overlying only a portion of said roughly defined base region;
   etching through said first film in substantially all areas not covered by said etching mask so as to expose a region of said crystalline substrate adjacent to a sidewall of said first film exposed by said etching; and
   a second step of epitaxially forming a second film of a second semiconductor composition and of a second conductivity type on said exposed region of said substrate adjacent to said sidewall of said first film;
   whereby a lateral, bipolar, heterojunction transistor is formed in said first and second films.

2. A method as recited in claim 1, wherein said first film is not exposed to ambient between said etching step and said second epitaxial forming step.

3. A method as recited in claim 2, wherein said etching step comprises exposing portions of said roughly defined base region through said first and second windows of said mask to a first melt; and thereafter performing said second epitaxial forming step comprising liquid phase epitaxy with a second melt.

4. A method as recited in claim 2, wherein said etching step comprises etching with an etching gas, and thereafter performing said second epitaxial forming step comprising chemical vapor deposition.

5. A method of fabricating a bipolar heterojunction transistor, comprising the steps of:
   epitaxially depositing a first layer of a first semiconductor composition and a first conductivity type over an insulating crystalline substrate;
   removing portions of said first layer to form a first region having first and second lateral sides;
   forming a mask over portions of said first region, said mask not covering said first and second lateral sides;
   etching said first region through said mask to thereby remove portions of said first layer adjacent to said first and second lateral sides, whereby a base region is formed; and
   then epitaxially depositing a second layer of a second semiconductor composition and a second conductivity type on said crystalline substrate adjacent to side portions of said first layer exposed by said etching step, whereby emitter and collector regions are formed.

6. A method as recited in claim 5, wherein said etching step and said step of depositing said second layer are performed without exposing said exposed side portions of said first layer to ambient.

7. A method of fabricating a V-groove heterojunction transistor, comprising the steps of:
   epitaxially depositing a first layer of a first semiconductor composition and a first semiconductivity type on an insulating crystalline substrate;
   forming a V-shaped groove in and through said first layer so as to expose a portion of said substrate; and
   epitaxially depositing a second layer of a second semiconductor composition and a second conductivity type on said exposed portion of said substrate, said second layer contacting side portions of said first layer exposed in said V-shaped groove and forming a base of a heterojunction transistor in said V-shaped groove, said side portions of said first layer forming an emitter and a collector of said heterojunction transistor.

8. A method as recited in claim 7, further comprising forming a mask over said first layer and having a mask groove therein and wherein said V-shaped groove forming step comprises applying an anisotropic etchant to said first layer through said mask groove.

9. A method as recited in claim 7, further comprising:
epitaxially depositing an insulating layer on said first layer prior to said V-shaped groove forming step;
wherein said V-shaped groove forming step forms said V-shaped groove in and through said insulating layer and said first layer; and
forming contact vias through said insulating layer to said first layer.

10. A method of fabricating a lateral heterojunction transistor, comprising the steps of:
a first step of epitaxially forming on a crystalline substrate a first film of a first semiconductor composition and of a first conductivity type;
depositing and defining an etching mask over a first region of said first film, wherein said mask comprises two islands separated by a groove;
etching through said first film in substantially all areas not covered by said etching mask so as to expose a region of said substrate adjacent to sidewalls of said first film exposed by said etching; and
a second step of epitaxially forming a second film of a second semiconductor composition and of a second conductivity type on said exposed region of said substrate adjacent to said sidewalls of said first film;
whereby a lateral, bipolar, heterojunction transistor is formed having an emitter and a collector in said first film and a base in said second film.

11. A method of fabricating a heterojunction structure, comprising the steps of:
a first step of epitaxially forming on a crystalline substrate a first film of a first semiconductor composition and of a first conductivity type;
a second step of epitaxially forming on said first film a second film of an insulating semiconductor composition;
depositing and defining an etching mask over a first region of said first film;
etching through said first film in substantially all areas not covered by said etching mask so as to expose a region of said substrate adjacent to a sidewall of said first film exposed by said etching; and
a third step of epitaxially forming a third film of a second semiconductor composition and of a second conductivity type on said exposed region of said substrate adjacent to said sidewall of said first film and partially over said second film;
whereby a lateral, bipolar heterojunction is formed at said sidewall between said first and third films.

12. A method as recited in claim 11, further comprising forming contact vias through said second film to said first film.

* * * * *